United States Patent [19]

Seio et al.

[11] Patent Number: 5,232,816
[45] Date of Patent: Aug. 3, 1993

[54] POSITIVE TYPE PHOTOSENSITIVE RESINOUS COMPOSITION COMPRISING A RESIN COPOLYMER HAVING AT LEAST A PHOSPHORIC ACID ESTER MONOMER

[75] Inventors: Mamoru Seio; Takeshi Ikeda; Kiyomi Sakurai, all of Osaka, Japan

[73] Assignee: Nippon Paint Co., Ltd., Osaka, Japan

[21] Appl. No.: 575,651

[22] Filed: Aug. 31, 1990

[30] Foreign Application Priority Data

Sep. 1, 1989 [JP] Japan .................. 227828

[51] Int. Cl.$^5$ .................. G03F 7/023; G03F 7/32; C08F 30/02
[52] U.S. Cl. .................. 430/192; 430/165; 430/191; 430/193; 430/326; 430/906; 430/910; 526/277
[58] Field of Search .................. 430/192, 193, 910, 191, 430/165, 326, 906; 526/277

[56] References Cited

U.S. PATENT DOCUMENTS

| | | | |
|---|---|---|---|
| 2,993,033 | 7/1961 | O'Brien | 526/277 |
| 4,123,279 | 10/1978 | Kobayashi | 430/192 |
| 4,384,037 | 5/1983 | Hosaka et al. | 430/910 |
| 4,511,645 | 4/1985 | Koike et al. | 430/910 |
| 4,797,345 | 1/1989 | Jeffries, III | 430/193 |
| 4,806,450 | 2/1989 | Hofmann et al. | 430/910 |
| 4,925,768 | 5/1990 | Iwasaki et al. | 430/910 |
| 4,946,757 | 8/1990 | Seio et al. | 430/192 |

OTHER PUBLICATIONS

Japanese Abstract 82-16373E/09 (Hitachi Chemical KK).
Japanese Abstract 82-010668 (Hitachi Chem. Co. Ltd).

*Primary Examiner*—Charles L. Bowers, Jr.
*Assistant Examiner*—John S. Chu
*Attorney, Agent, or Firm*—Wenderoth, Lind & Ponack

[57] ABSTRACT

A positive type photosensitive resinous composition comprising a binder resin and a quinone diazide compound, the binder resin being a copolymer of
(a) at least one phosphoric acid ester monomer represented by the formula:

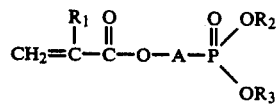

(b) at least one acid group containing $\alpha,\beta$-ethylenically unsaturated monomer, and
(c) other copolymerizable $\alpha,\beta$-ethylenically unsaturated monomers than (a) and (b), which is specifically useful for the formation of resist coating in the preparation of printed circuit board.

1 Claim, No Drawings

POSITIVE TYPE PHOTOSENSITIVE RESINOUS COMPOSITION COMPRISING A RESIN COPOLYMER HAVING AT LEAST A PHOSPHORIC ACID ESTER MONOMER

FIELD OF THE INVENTION

The present invention relates to a positive type photosensitive resinous composition which is specifically useful for the formation of a resist coating to be advantageously used for the preparation of printed circuit boards.

BACKGROUND OF THE INVENTION

A positive type photosensitive resinous composition has been widely used in the manufacturing process of semi-conductor devices, printed circuit boards, printing plates and the like.

Most popular positive type photosensitive resinous composition comprises an alkali soluble novolak resin added with a quinone diazide compound.

Since the quinone diazide compound is soluble in an organic solvent but insoluble in water, the formed resinous coating is hardly soluble in an aqueous alkaline developer.

However, when the coating is exposed to UV rays, the exposed quinone diazide group is decomposed, being changed to ketene and then to carboxylic groups.

Therefore, the exposed area may be converted to a soluble nature, and such decomposition is ingeniously utilized in that system.

As for positive type photosensitive materials typical examples are 1,2-quinone diazide compounds described in, for example, "Light-sensitive Systems" J. Kosar, John Wiley and Sons Inc. 339-357, and various patents and publications.

Such positive type photosensitive composition is, in general, far more excellent in resolving power than those of negative type photosensitive resinous compositions and hence is widely used as an etching resist in the preparation of printed circuits boards, integrated circuit and the like.

However, since the base material is a novolac resin prepared by a polycondensation, there is a wide fluctuation in the properties of the resin product and since the softening point is considerably high despite of the comparatively lower molecular weight of the resin, there is the drawback of excessive brittleness in respect to the resist film prepared. Furthermore, since the adhesion to the base plate is not good, it is still desired to increase the adhesion properties.

There is an another approach wherein a 1,2-quinone diazide compound is admixed with an acrylic resin which is a copolymer of a conjugated diolefinic hydrocarbon a, monoolefinic unsaturated compound and an α,β-ethylenically unsaturated carboxylic acid, as disclosed in Japanese Patent Publication (unexamined) 122031/81.

This system may impart the desired flexibility to the resist film, therefore resulting in excellent adhesion between the base plate and the formed resist film.

However, in order to give the desired alkali solubility to the exposed resist film, it is essential that the content of α,β-ethylenically unsaturated carboxylic acid in said acrylic resin should be as high as possible, which, in turn, will cause the undesired swelling of the unexposed image area in the developing stage, resulting in poor resolving power.

The inventors have previously proposed, under the circumstances, positive type photosensitive resinous compositions which are excellent in flexibility and adhesion of the formed resist film and extremely low in swelling of the unexposed resist at the time of development (as, for example, Japanese Patent Publication (unexamined) 189857/88, ibid 281153/88, ibid 281154/88).

However, despite of such proposals, there is an undesired decrease in the film properties under severe conditions.

Especially, in the case of using such composition as an etching resist for the preparation of printed circuit boards with an electrolytically copper-plated board, the etching time in the actual production line is usually set in a range of 1.1 to 1.5 times the required etching time to remove the undesired copper, paying due consideration of fluctuation in the plating thickness in the base plate and between the respective base plates.

Therefore, as an etching resist film, a far better adhesion to the copper surface is usually required.

Nevertheless, the proposed resinous compositions cannot give a fully satisfying answer to this problem.

In order to improve the adhesion of photosensitive resinous compositions toward metals and the like, various proposals for making use of phosphoric ester compounds have been made.

For example, in Japanese Patent Publication No. 27457/76, there is mentioned a composition comprising, as essential components, an ester of phosphoric acid with a hydroxyl of polymerizable monomer, vinyl monomers and particular urethane modified oilfree alkyd resin; in Japanese Patent Publication (unexamined) No. 99202/81, a photo-curing type composition containing a particular phosphoric acid component and having improved adhesion properties to the metal substrate; and in Japanese Patent Publication (unexamined) No. 10668/82, a photo-curing type adhesive composition, based on a low molecular weight acrylic copolymer containing a specified amount of a particular organic phosphoric acid ester monomer.

Other compositions containing phosphoric acid ester compounds having polymerizable unsaturated bonds are stated in Japanese Patent Publication (unexamined) Nos. 67751/78; 17569/82; 18263/83; 208313/85; 32044/87; 92618/88 and the like.

The phosphoric acid ester compounds used in these techniques are characterized in that at least one free phosphoric acid group is necessarily contained in the molecule of said compound.

It is understood that due to its higher polarity and large dissociation constant alone or to its synergism with the particular type of combined materials, adhesion toward metals or other substrates must be increased.

It is, therefore, easily thought of by those skilled in the art, to make use of the abovementioned technique in a positive type photosensitive resinous composition.

In fact, in Japanese Patent Publication, (unexamined) Nos. 206293/86, 189857/88 and 281153/88, all filed by Nippon Paint Co. Ltd, such phosphoric acid ester groups have been incorporated into acrylic resins by effecting copolymerization of phosphoric acid ester compounds having polymerizable unsaturation bonds and other copolymerizable acrylic monomers.

However, in the case of positive type photosensitive resinous compositions, the unexposed area (the so-called pattern area desired) must be resistant toward alkaline developers and should not be dissolved or swollen in the developer, while the exposed area (the so-called undesired portion) is dissolved and removed off by the alkaline developer.

However, if the phosphoric acid compound is introduced in the resin in a sufficient quantity required to improve the adhesion to the metal, the alkaline resistance at the unexposed area will inevitably be lowered due to the alkaline affinity of the phosphoric acid groups, and there always occurs, at the time of development, undesired swelling of the unexposed area or undesired solution problems.

Thus, there occurs new troublesome questions that the solubility difference between the unexposed and exposed areas will become very small.

It is, therefore, an object of the invention to provide a positive type photosensitive, resinous composition which is excellent in adhesion toward metals and whose coating is extremely resistant to swelling, at the unexposed area, in an alkaline developer and which is specifically useful as a resist film.

SUMMARY OF THE INVENTION

According to the invention, the abovementioned object can be attained with a positive type photosensitive resinous composition comprising as essential components a binder resin component and a quinone diazide compound, the resin being a copolymer of (a) at least one phosphoric acid ester monomer represented by the formula:

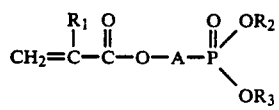

wherein $R_1$ represents hydrogen, chlorine atom or methyl;

A is $-R_4-O-$, $\hspace{1mm}+R_5-O\hspace{1mm}\overline{)_m}$ or $-R_6+O-C-R_7-O\hspace{1mm}\overline{)_n}$; $R_4$ is a
$\hspace{15mm}\|$
$\hspace{15mm}O$ straight or branched chain alkylene having 2 to 6 carbon atoms a or cyclic alkylene having 3 to 6 carbon atoms; $R_5$ is an alkylene having 2 to 5 carbon atoms; $R_6$ is ethylene or propylene; $R_7$ is an alkylene having 2 to 7 carbon atoms; m and n are the average numbers of the respective repeating units and m is 1–10 and n is 2–50; $R_2$ and $R_3$ are the same or different groups and selected from alkyl, substituted alkyl or phenyl in an amount of 0.05 to 20 parts by weight per 100 parts by weight of the copolymer, (b) at least one acid group containing $\alpha,\beta$-ethylenically unsaturated monomer in an amount to give an acid value of the copolymer of 20 to 200, and (c) other copolymerizable $\alpha,\beta$-ethylenically unsaturated monomers than (a) and (b).

The abovementioned phosphoric acid ester monomer (a) has an extremely large metal-adhesion providing effect has no free acid protons, and therefore, when introduced into the molecule of the binder resin, the desired adhesion can be obtained without causing any decrease in the alkaline resistance of the resin.

Such phosphoric acid ester monomers bearing polymerizable unsaturation bonds may be advantageously prepared by the known processes as disclosed in, for example, Japanese Patent Publication Nos. 10311/60, ibid 13476/60, ibid 5393/61 and the like, and typical examples are as follows,

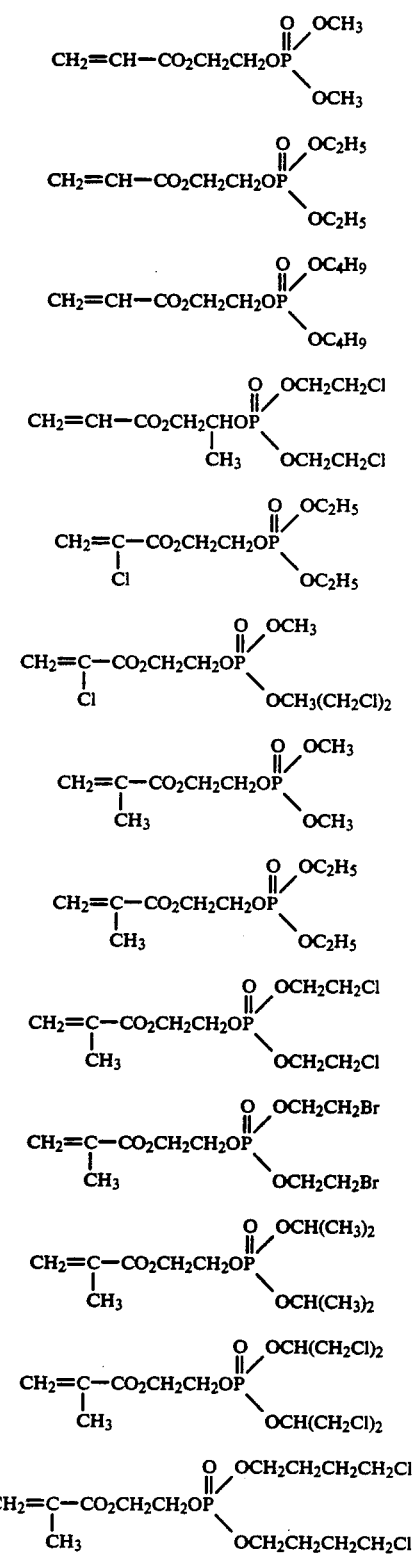

-continued

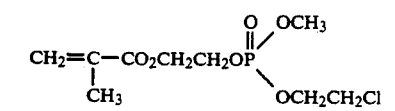
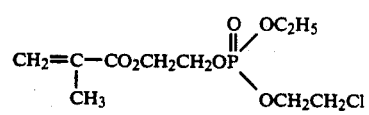
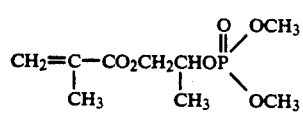
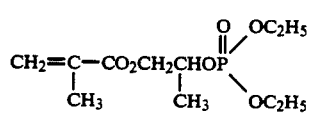
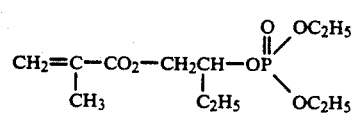
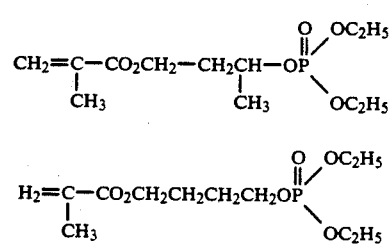
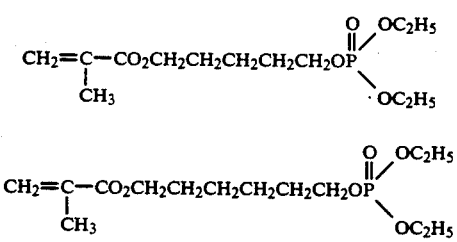
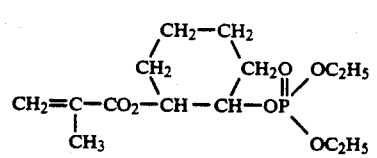
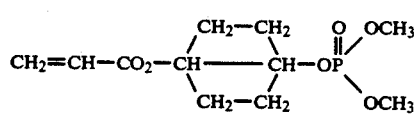
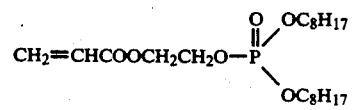
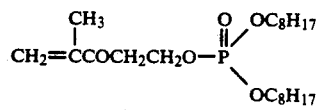

-continued

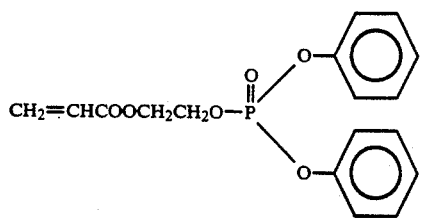
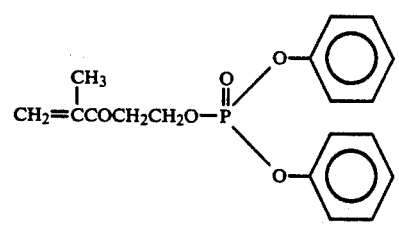
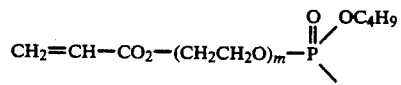
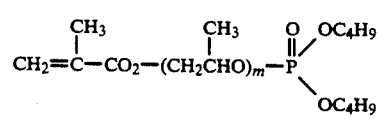
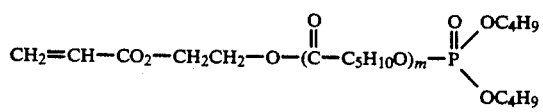

(m and n are as defined herein before)

Since the phosphoric acid ester monomers have an extremely strong metal-adhesion providing effect, the content of such monomer in the resin may be sufficiently in a range of 0.05 to 20 parts by weight, preferably 0.01 to 10 parts by weight, to give the desired adhesion toward metal.

Among these monomers particular preference is given to diphenyl acryloyloxy ethyl phosphate and diphenyl methacryloyl oxy ethyl phosphate.

The present acrylic resin composition may be advantageously prepared by effecting copolymerization, by conventional means, of such phosphoric acid ester monomer bearing polymerizable unsaturated bonds and other copolymerizable $\alpha,\beta$-ethylenically unsaturated monomers.

However, for electrodeposition coating purpose and for the alkali-solubilization purpose at the development stage, it is essential to copolymerize with a monomer containing at least one acid group as mentioned, e.g. carboxylic acid groups, sulfonic acid groups or phosphoric acid groups.

Examples of monomers containing such acid group are as follows:

(1) monomer containing carboxylic acid groups: acrylic acid, methacrylic acid, crotonic acid, itaconic acid, maleic acid, fumaric acid and the like.

(2) monomer containing sulfonic acid group: 1-acryloxy-1-propane sulfonic acid, 2-acrylamide-2-methyl propane sulfonic acid, 3-methacrylamide-1-hexane sulfonic acid and the like.

(3) monomer containing phosphoric acid groups:

acid phosphoxy ethyl methacrylate, acid phosphoxy propyl methacrylate and the like.

(4) unsaturated monomers represented by the formula [I] or [II] of Japanese Patent Publication (unexamined) 189857/88.

However, the desired solubility difference between the exposed and unexposed areas of the resist layer is hardly obtained with the acryl copolymer containing sulfonic acid groups or phosphoric acid groups bearing monomers alone due to its strong alkali-affinity, and therefore, for the said object, it is much preferred to rely on the carboxylic acid groups containing monomers and to add a small amount of sulfonic acid or phosphoric acid group containing monomers as an alkali-solubilization assistant.

Such acid group containing monomer is usually employed in an amount to give an acid value of the copolymer of 20 to 200.

If the content of such monomer is less than the amount necessary to give an acid value of 20, there results in an acrylic resin which is poor in alkaline solubility, causing inferior developing properties.

Whereas, if the amount it exceeds the amount necessary to give an acid value of 200, the desired resistance toward the alkaline developer is lost, causing undesired solution of the unexposed image area.

As the third monomer component of $\alpha,\beta$-ethylenically unsaturated compounds, appropriate members are selected from the known various types of $\alpha,\beta$-ethylenically unsaturated compounds by paying due regard to the desired Tg, Sp, solubility and other properties of the binder resin.

Examples of such compounds are acrylates and methacrylates (e.g. methyl acrylate, methyl methacrylate, ethyl acrylate, ethyl methacrylate, n-butyl acrylate, n-butyl methacrylate, i-butyl acrylate, i-butyl methacrylate, t-butyl acrylate, t-butyl methacrylate, 2-ethyl hexyl acrylate, 2-ethyl hexyl methacrylate, lauryl acrylate, lauryl methacrylate and the like); polymerizable aromatic compounds as styrene, vinyl toluene and the like; polymerizable amide compounds as acryl amide, methacryl amide, diacetone acryl amide, N-methylol acryl amide and the like; polymerizable nitrile compounds as acrylonitrile, methacrylonitrile and the like; and hydroxyl group containing compounds as 2-hydroxy ethyl acrylate, 2-hydroxy ethyl methacrylate, hydroxy propyl acrylate, hydroxy propyl methacrylate, allyl alcohol and the like.

Other members are phenolic hydroxyl bearing unsaturated monomers stated in Japanese Patent Publication (unexamined) Nos. 206293/86 and 281153/88, including the reaction products of aromatic compounds having both phenolic, hydroxyl groups and carboxyl groups and a glycidyl groups of unsaturated monomer or hydroxyl groups of unsaturated monomers.

Such monomers are used each singularly or in combination of two or more, together with the abovementioned monomers (a) and (b).

Polymerization is carried out by using any conventional polymerization means.

The molecular weight of those obtained acryl resin to be used in the present invention should be, in terms of weight average molecular weight, in a range of 1,000 to 200,000, and preferably 3,000 to 100,000.

If the weight-average molecular weight of the resin is more than 200,000, it cannot be used in the present resinous compositions because the solubility of the resins in alkaline developers are extremely low and hence an excessively long development time is required.

If the weight-average molecular weight is less than 1,000, the solubility of the resin in an aqueous alkaline solution will become excessively high, causing the formation of a slender line pattern.

As the quinone diazide compound, any of the heretofore known members may be satisfactorily used.

Examples are 1,2-benzoquinone diazide-4-sulfonic acid ester, 1,2-naphthoquinone diazide-5-sulfonic acid ester, 1,2-benzoquinone diazide sulfonic acid amide, 1,2-naphthoquinone diazide-4-sulfonic acid amide, 1,2-naphthoquinone diazide-5-sulfonic acid amide and the like.

More specifically, mention is made of such 1,2-quinone diazide compounds as disclosed in J. Kosar "Light-Sensitive Systems" 339–352 (1965) John Wiley & Sons Inc. (New York) and W. S. De Forest "Photoresist" 50 (1975), McGraw-Hill, Inc. (New York).

That is, 1,2-benzoquinone diazide-4-sulfonic acid phenyl ester, 1,2,1',2'-di (benzoquinone diazide-4-sulfonyl)-dihydroxy biphenyl, 1,2 benzoquinone diazide-4-(N-ethyl-N-$\beta$-naphthyl)-sulfonamide, 1,2-naphthoquinone diazide-5-sulfonic acid cyclohexyl ester, 1-(1,2-naphthoquinone diazide-5-sulfonyl)-3.5-dimethyl pyrazole, 1,2-naphthoquinone diazide-5-sulfonic acid-4'-hydroxy diphenyl-4'-azo-$\beta$-naphthol ester, N,N'-di-(1,2-naphthoquinone diazide-5-sulfonyl)-aniline, 2'-(1,2-naphthoquinone diazide-5-sulfonyl oxy)-1-hydroxy-anthraquinone, 1,2-naphthoquinone diazide-5-sulfonic acid-2,3,4-trihydroxy benzophenone ester, condensation product of 2 moles of 1,2-naphthoquinone diazide-5-sulfonyl chloride and 1 mole of 4,4'-diamino benzophenone, condensation product of 2 moles of 1,2-naphthoquinone diazide-5-sulfonyl chloride and 1 mole of 4,4'-dihydroxy-1,1'-diphenyl sulfone, condensation product of 1 mole of 1,2-naphthoquinone diazide-5-sulfonyl chloride and 1 mole of purpurogallin, 1,2-naphthoquinone diazide-5-(N-dihydro abietyl)-sulfonamide and the like.

Furthermore, such quinone diazide ester compounds derived from polyepoxide compounds and phenolic hydroxyl groups of other compounds as disclosed in Japanese Patent Publication (unexamined) 6948/89 may also be advantageously used.

The amount of the added quinone diazide compound is preferably in a range of 3 to 150 parts by weight, more preferably 5 to 100 parts by weight per 100 parts by weight of the acrylic resin composition.

If the quinone diazide compound is less than 3 parts by weight, the amount of carboxylic acid to be generated after exposure will be too limited and hence it cannot produce the desired difference in the solubility of the resist layer toward the akaline developer, before and after exposure, resulting in difficulties in patterning.

When the quinone diazide compound exceeds the upper limit of 150 parts by weight, most of the quinone diazide compounds will remain as they are after a short time exposure, and it is quite difficult to effect an optimum development of the exposed resist layer.

At the time when a phenolic hydroxyl group of unsaturated monomer is included in the monomers of the disclosed acrylic resin, all or a part of said hydroxyl groups may be reacted with a reactive derivative of the quinone diazide compound, such as 1,2-benzoquinone diazide-4-sulfonic halide, 1,2-naphthoquinone diazide-4-sulfonic halide, 1,2-naphthoquinone diazide-5-sulfonic halide or the like, to give a comparatively higher molecular weight naphthoquinone compound.

Since a photosensitive group is included in the resinous body, such resin may be used alone or in combination from with the present acrylic resin composition or other quinone diazide compounds as desired.

The present positive type photosensitive resinous composition may further include other optional additives as storage stabilizers, pigments, coloring matter and the like.

The present resinous composition may be dissolved in an appropriate solvent, applied on a substrate by using a conventional application means as spinner, coater and the like, and dried to form a photosensitive resinous layer.

Appropriate solvents are glycol ethers, such as ethylene glycol monomethyl ether, ethylene glycol monoethyl ether, ethylene glycol monobutyl ether and the like; cellosolve acetates as methyl cellosolve acetate, ethyl cellosolve acetate and the like; aromatic hydrocarbons, such as toluene, xylene and the like; ketones, such as methyl ethyl ketone, cyclohexanone and the like; and esters, such as ethyl acetate, butyl acetate and the like.

They may be used each singularly or in combination of 2 or more.

As the coating substrate, any of such members as silicone wafers, aluminium plates, plastic film, paper, glass plates, steel plates, printed circuit boards using a copper-clad laminate and the like may be appropriately selected and used.

The present positive type photosensitive resinous composition is specifically useful for the coating of a conductive substrate, such as a copper-clad laminate for printed circuit boards, by an electrodeposition coating means.

In such electrodeposition coating method as stated in Japanese Patent Publication (unexamined) Nos. 206293/86, 189857/88 and 281153/88, by the adoption of the present resinous composition, one can to attain an improved adhesion of the coating onto the base plate, without causing any troubles in the electrodeposition properties of the said composition.

This is because the phosphoric acid ester compound is included in the binder resin, but there is no free phosphoric acid proton in the system.

In order to obtain an electrodeposition coating composition, the present positive type photosensitive resinous composition should be dissolved or dispersed in water and to this end, the acidic groups contained in the binder resin should be neutralized with a basic material.

Examples of such basic materials are alkanol amines, such as monoethanol amines, diethanol amines, triethanol amines and the like; alkylamines, such as monoethyl amine, diethyl amine, triethylamine and the like; alkyl alkanol amines, such as dimethylamino ethanol and the like; alkali metal hydroxides, such as sodium hydroxide, potassium hydroxide and the like; and ammonia.

They are used each in singularly or in a combination of 2 or more.

The amount of basic material to be used for neutralization may be preferably selected in a range of 0.2 to 1.0 equivalent per equivalent of acidic groups contained in the acrylic resin.

If the amount of basic material is less than 0.2 equivalent, there is a tendency that the water dispersion stability may be adversely affected and the quantity of precipitation may be formed with the lapse of time.

Whereas, if the amount of basic material exceeds 1.0 equivalent, the stability of the quinone diazide compound is liable to be decreased and the water dispersion will be colored with the lapse of time.

The aqueous dispersion or solution of the electrodeposition coating composition of this invention may be advantageously prepared by first preparing a mixture of acid group bearing alkali soluble binder resins having acid group quinone diazide compounds, neutralizing agents, other optional additives and organic solvents, and then diluting the mixture with water.

In this invention, besides the abovementioned main ingredients, various additives may be added as desired, e.g. organic solvents for the control of the electrodeposition coating, the thickness and the thermal flow characteristics of the electrodeposition coating, dyestuffs and pigments for the formation of visable images, defoaming agents surfactants and the like.

By the adoption of electrodeposition coating means, the present positive type photosensitive resinous compositions may be easily applied on any shaped material, providing they have a conductive surface thereon.

A particularly important application is for, the coating of copper-clad laminates and electro-plated boards for the a printed circuit board having small-size through-holes.

In carrying out an electrodeposition coating with the abovementioned coating composition, the electrodeposition bath is controlled in a solid content of 3 to 40%, preferably 5 to 25%, the bath temperature is maintained in a range of 10° to 40° C., preferably 15° to 35° C., the substrate having a conductive surface is dipped in the bath and connected to an anode, the bath wall is connected to a cathode and a direct current is applied to the electrodes until coating a desired thickness is obtained.

After electrodeposition coating, the coated plate is taken out, washed with water and dried in a conventional way to obtain a plate coated with a positive type photosensitive resin layer having no pinholes and a uniform thickness.

Said drying may be advantageously carried out at 40° to 150° C., preferably 60° to 130° C.

If the drying temperature is less than 40° C., the desired drying may be obtained in a long drying time but one cannot restore the pinholes resulting from the generation of gas by an electrode reaction.

If the temperature exceeds 150° C., there is a tendency forthe quinone diazide compound to decompose.

In obtaining the desired resist pattern, the photosensitive layer prepared by using the present positive type photosensitive resinous composition is exposed, through a positive pattern film (circuit pattern mask), to an actinic light and the exposed area is dissolved out by the subsequent development operation.

The light source used may be any actinic lights having a wave-length band of 300 to 450 nm.

Examples are high pressure mercury lamps, super high pressure mercury lamps, metal halide lamps, xenon lamps, arc lamps and the like.

The development may be easily carried out with a conventional weak aqueous alkaline solution, by a, spraying, brushing and the like.

Among them, particular preference is given to spraying.

Examples of developers are aqueous solutions of such alkaline materials as inorganic alkalis such as sodium carbonate, sodium silicate, sodium metasilicate, trisodium phosphate, sodium hydroxide, potassium hydroxide and the like; organic amines, e.g. n-propyl amine, di-n-propyl amine, pyrrol, piperadine, piperidine, triethylenediamine, dimethyl ethanol amine, triethanol amine, diethyl hydroxyl amine and the like; quaternary ammonium salts, e.g. tetramethyl ammonium hydroxide, tetraethyl ammonium hydroxide and the like; ammonia and the like.

If desired, other additives, such as water soluble organic solvents, surfactants, defoaming agents and the like may be added to the developer.

Next, in the preparation of a printed circuit board, the plate with a circuit resist pattern is subjected to an etching operation with an etching solution containing ferric chloride, cupric chloride or the like.

At that time, the inside surfaces of the minivia-holes, if any, may be effectively and safely protected by the said etching resist.

Finally, the unexposed resist, which still remains on the conductive layer including the resist on the inside surfaces of the minivia-holes, is removed by the treatment with a strong alkaline aqueous solution, such as sodium hydroxide, potassium hydroxide or the like and the desired copper circuit pattern is obtained.

The present positive type photosensitive resinous composition is excellent in metal adhesion and the formed layer has characteristics, such that at the time of development, there is extremely little swelling of the unexposed (image) area and hence the layer is excellent in resolving power and has a wide development latitude.

When the present resinous composition is formulated in an aqueous dispersion to be used as an electrodeposition coating bath, said dispersion is excellent in storage stability, shows excellent coverage on uneven surfaces, and is capable of resulting in a non-tacky, smooth and uniform resist coating.

The thus-obtained photosensitive resin film is specifically useful for the preparation of a highly density fine circuit pattern board.

The present invention shall be now more fully explained in the following Examples.

Unless otherwise stated, all parts and percentages are by weight.

EXAMPLE 1

Into a 1 l glass reactor fitted with a stirrer, a condenser, a thermometer, a dropping funnel and a nitrogen gas inlet tube, was placed 300 parts of ethylene glycol monobutyl ether.

To this, a mixture of 200 parts of methyl methacrylate, 167.3 parts of n-butyl methacrylate, 30.7 parts of methacrylic acid, 2 parts of dibutoxy methacryloyl oxy ethyl phosphate and 16 parts of t-butyl peroxy-2-ethyl hexanoate (polymerization initiator) was added dropwise while maintaining the temperature at 120° C. and introducing a nitrogen gas stream into the reactor over a period of 3 hours and then the mixture was maintained at the same temperature for an additional 2 hours to obtain a resinous varnish of acryl resin having a weight-average molecular weight of 20,000.

Next, 20 parts of said resinous varnish were mixed with a solution of 3 parts of 1,2-naphthoquinone diazide-5-sulfonic acid 2,3,4-trihydroxybenzophenone ester in 20 parts of methyl ethyl ketone and the thus obtained composition was applied by using a coater onto a copper-clad laminate (Cu thickness 35 $\mu$m) and dried at 80° C. for 10 minutes to obtain a positive type photosensitive resin layer of a dry film thickness of 6 $\mu$m.

Next, a positive film having a line-and-space pattern with 10 $\mu$m unit-stepped lines from 30 $\mu$ to 100 $\mu$m was placed on the resinous film and the product was exposed by using an HMW-201B exposing machine (manufactured by Oak Seisakusho K. K.) to an exposure of 300 mj/cm$^2$, developed by spraying a 1% sodium metasilicate aqueous solution (30° C.) for 1 minute and finally subjected to etching with a ferric chloride aqueous solution (40° C.) for 2 minutes to obtain copper pattern having up to 80 $\mu$m line width.

EXAMPLE 2

Into a 1 l glass reactor fitted with a stirrer, a condenser, a thermometer and an air inlet tube, was placed 207.2 parts of phthalic anhydride, 501.2 parts of Placcel FM-2 (2:1 mole addition product of $\epsilon$-caprolactone and 2-hydroxy ethyl methacrylate, manufactured by Daicel Chem. Co.) and 500 ppm (to the total material) of hydroquinone monomethyl ether and the mixture was reacted, while introducing air, at 150° C. for 1 hour.

Thereafter, the mixture was allowed to cool to room temperature and filtered to obtain a reactive acrylic monomer.

An acid value of the reactive acrylic monomer was 114 and the reaction percentage calculated from said acid value was 97%.

Into a 1 l glass reactor fitted with a stirrer, a condenser, a thermometer, a dropping funnel and a nitrogen gas inlet tube, was placed 300 parts of ethylene glycol monobutyl ether.

To this, a mixture of 140 parts of the abovementioned acryl monomer, 130 parts of methyl methacrylate, 26 parts of n-butyl acrylate, 4 parts of dibutoxy methacryloyl oxy ethyl phosphate and 10 parts of t-butyl peroxy-2-ethyl hexanoate (polymerization initiator) was added dropwise while maintaining the temperature at 120° C. and introducing air into the reactor over a period of 3 hours and then the mixture was maintained at the same temperature for additional 2 hours to obtain a resinous varnish of acrylic resin having a weight-average molecular weight of 30,000.

Next, 20 parts of said resinous varnish were mixed with a solution of 4 parts of 1,2-naphthoquinone diazide-5-sulfonic acid 2,3,4-trihydroxybenzophenone ester in 20 parts of methyl ethyl ketone and the thus obtained composition was applied, dried, exposed, developed and etched as in Example 1 to obtain a copper pattern having up to 50 $\mu$m line width.

EXAMPLE 3

Into a 1 l glass reactor, were placed 276 parts of 0-hydroxy benzoic acid, 5.4 parts of N,N'-dimethyl benzylamine, 0.14 part of hydroquinone and 150 parts of dioxane and the mixture was stirred and heated too 100° C.

After adding 284 parts of glycidyl methacrylate, the combination was stirred at 100° C. for 6 hours while introducing air.

The thus obtained product was confirmed to be 3-(0-hydroxy benzoyloxy)-2-(hydroxy) propyl methacrylate from 1R spectrum and NMR spectrum analysis.

Next, into a reactor, was placed 260 parts of ethylene glycol monomethyl ether and to this, a monomer mixture of 100 parts of the abovementioned reactive acryl monomer, 200 parts of methyl methacrylate, 80.5 parts of n-butyl acrylate, 24.5 parts of methacrylic acid, 10 parts of t-butyl peroxy-2-ethyl hexanoate and 3 parts of diphenyl acryloyloxy and a solution of 12 parts of 2-acrylamide-2-methyl propanesulfonic acid in a mixture of 20 parts of ethyleneglycol monomethyl ether and 20 parts of deionized water were added dropwise under nitrogen gas stream while maintaining the inner temperature at 120° C., for 3 hours.

Thereafter, the combination was maintained at the same temperature for an additional two hours to obtain a resinous varnish of acryl resin having a weight-average molecular weight of 26,000.

Next, 20 parts of the thus obtained varnish was combined with a solution of 3 parts of 1,2-naphthoquinone diazide-5-sulfonic acid-2,3,4-trihydroxy benzophenone ester in 20 parts of methyl ethyl ketone and the resulting composition was applied, dried and exposed, developed and etched as in Example 1, to obtain a copper pattern having up to 30 μm line pattern.

EXAMPLE 4

Into a 1 l glass reactor fitted with a stirrer, a condenser, a decanter and an air inlet tube, was placed 358 parts of Placcel FM-2 (2:1 mole addition product of εcaprolactone: 2-hydroxy ethyl methacrylate, manufactured by Daicel Chem. Co.).

To this, 131 parts of salicylic acid, 0.5 part of dibutyl tin oxide, 15 parts of xylene and 1.5 parts of hydroquinone were added and the combination was, while introducing air, heated to 180° C. and reacted until the acid value reached 3 or less, which was then allowed to cool.

Next, in a separate reactor, was placed 250 parts of ethylene glycol monobutyl ether, and a mixture of 135 parts of the abovementioned reactive acryl monomer, 140 parts of methyl methacrylate, 208 parts of n-butyl acrylate, 20 parts of acrylic acid, 2 parts of diphenyl methacryloyloxy ethyl phosphate and 10 parts of azobis isobutyronitrile was dropwise added, while introducing a nitrogen gas stream and maintaining the inner temperature at 120° C., over a period of 3 hours.

After elapsing 30 minutes, a mixture of 25 parts of ethylene glycol monobutyl ether and 1 part of azobis-isobutyronitrile was added dropwise over in an hour and the combination was maintained at the same temperature for 1 hour.

Into a 3 liters separable flask fitted with a thermometer, a condenser, and a stirrer, was placed 500 parts of the thus obtained acryl resin varnish, and a solution of 44 parts of 1,2-naphthoquinone diazide-5-sulfonyl chloride in 1520 parts of acetone was added, at room temperature, thereto.

Thereafter, 19.6 parts of triethylamine was added dropwise in 1 hour and the combination was reacted at the room temperature for 2 hours.

After removing the precipitate, the filtrate was added dropwise over a period of about 20 times water under stirring in 1 hour and the brown colored resinous material was separated and dried. (Number-average molecular weight 6,400, quinone diazide equivalent determined by fluorecent X-ray analysis $4.2 \times 10^{-4}$ equivalent/g).

60 parts of the thus prepared photosensitive resin was dissolved in 40 parts of methyl ethyl ketone and to this, 2,2 parts of triethyl amine and 497 parts of deionized water were added under stirring to obtain an aqueous dispersion of a photosensitive resin.

A circuit base substrate consisting of an insulating base plate with 0.6mm through-holes was previously subjected to electroless copper plating and an electrolytic copper plating to obtain a base plate for a double sided, printed circuit board having a copper film of 43 μm thickness.

This board was dipped into the abovementioned aqueous dispersion, the board was connected to an anode and the metallic wall of the bath to a cathode.

Thereafter, a direct current of 50 mA/dm$^2$ was impressed for 90 seconds, and the board was washed with water and dried in a drier at 100° C. for 5 minutes to form a positive type, photosensitive resin film of 7 μm dry thickness.

The thus obtained resin film had no pin-holes and was of uniform thickness.

Even the inside of the respective through hole was completely covered by the resin film.

On said photosensitive resin film, was placed a positive type photomask with a circuit pattern and the sandwitch was illuminated from both sides by using an HMW-201B type exposuring machine (Oak Seisakusho) so as to give an exposure of 350 mj/cm$_2$ on each surface, and developed in an aqueous 1% sodium metasilicate solution at 35° C. for 1 minute to obtain a reproduction of line patterns with precise line widths, which were free from pin-holes, resist separation and cracks.

After exposure, the board was etched by using a ferric chloride solution at 40° C. for 150 seconds, the treated plate was washed with water and the resin film still remaining on the circuit pattern was removed by using an aqueous 3% sodium hydroxide solution at 50° C. to obtain the desired circuit pattern having the minimum line width of 50 μm and having no defects.

At that time, the copper coating within the unexposed through-hole was completely remained without being etched and electrical passage was secured at that portion.

EXAMPLE 5

Into a similar reaction vessel as used in Example 2, was placed 148 parts of phthalic anhydride, 400 parts of Blenmer PP-1,000 (5.5:1 mole addition product of propylene oxide: methacrylic acid, manufactured by Nippon Yushi K. K.) and 500 ppm of hydroquinone monomethyl ether to the total charge and the mixture was reacted, while introducing air, at 150° C. for 60 minutes under stirring.

The thus obtained reactive acrylic monomer had an acid value of 108, showing a reactive percentage of 95%.

Next, an acrylic resin varnish was prepared, following the procedures of Example 1, with the materials shown below.

| | |
|---|---|
| the abovementioned acrylic monomer | 75 parts |
| methyl methacrylate | 75 |
| n-butyl acrylate | 50 |
| acrylonitrile | 23 |
| diphenyl methacryloyloxy ethyl phosphate | 2 |
| t-butyl peroxy-2-ethyl hexanoate | 4.5 |
| ethylene glycol monobutyl ether | 180 |

The weight-average molecular weight of the reaction product was 32,000.

Into a 1 l glass reactor firted with a stirrer, a condenser and a thermometer, was placed 100 parts of polyethylene glycol diglycidyl ether (epoxy equivalent 192.5), 71.8 parts of salicylic acid and 28 parts of ethylene glycol monoethyl ether acetate and after heating to 120° C., 0.5 part of benzyl dimethylamine (catalyst) was added and the combination was reacted for 6 hours.

The acid value of the reaction mixture was 5.6, showing a reaction percentage of 96.2%.

Next, the content was cooled to 10° C., added with 105 parts of 1,2-naphthoquinone diazide-5-sulfonyl chloride and 160 parts of dioxane and to thus obtained solution, 43.5 parts of triethylamine was added dropwise and the combination was reacted at 10° C. for 2 hours. Thereafter, the reaction mixture was added dropwise to a large quantity of 2% aqueous HCl solution to effect precipitation.

The thus formed precipitate was filtered, washed with water and dried in a vacuum at 40° C. for 15 hours to obtain a positive type photosensitive resin (93% yield).

To 144 parts of the abovementioned acrylic resin varnish, a solution of 20 parts of the abovementioned positive type photosensitive resin in 20 parts of propyleneglycol monomethyl ether was added, and the combination was then added with 4.5 parts of triethylamine and 815.5 parts of deionized water to obtain an electrodeposition coating composition.

A similar board having a copper film of 43 μm thickness as used in Example 4 was dipped in the abovementioned electrodeposition coating composition, and a direct current of 50 mA/dm² was applied for 90 seconds as in Example 4, to obtain a positive type photosensitive resin layer of 7 μm thickness.

The thus obtained coating was free from pin-holes, had a uniform film thickness and even the inside of the respective through-hole was completely covered with said coating.

Thereafter, the similar exposure, development and etching procedures as stated in Example 4 were carried out to obtain a circuit pattern having a minimum line width of 40 μm and free from defects.

The copper within the unexposed through-hole was remained as it is and thus the desired electric passage was secured.

EXAMPLE 6

Into a similar reaction vessel as used in Example 2, was placed 77 parts of trimellitic anhydride, 300 parts of Placcel FM-5 (5:1 mole addition product of ε-caprolactone: 2hydroxyethyl methacrylate, manufactured by Daicel Chem. Co.) and 500 ppm of hydroquinone monomethyl ether to the total charge and while introducing an air, the content was stirred at 165° C. (inner temperature) for 30 minutes to effect reaction.

Thereafter, the content was hot-filtered to remove a small amount of unreacted materials.

The reaction product was a semi-solid material (25° C.) having an acid value of 125.

To the abovementioned product, 100 parts of cardula E-10 (glycidyl versatate, manufactured by Shell Chem.) was added and again reacted, while introducing air and stirring, at 150° C. (inner temperature) for 40 minutes.

The thus obtained reactive acrylic monomer had an acid value of 52, indicating a reaction percentage of 95%.

The similar procedures as stated in Example 1 were repeated except for using the following materials, to obtain an acryl resin varnish.

| | |
|---|---|
| the abovementioned acrylic monomer | 77 parts |
| methacrylic acid | 6.2 |
| methyl methacrylate | 79.5 |
| n-butyl methacrylate | 36 |
| diphenyl methacryloyloxy ethyl phosphate | 0.8 |
| Phosmer PP* | 0.5 |
| t-butyl peroxy-2-ethyl hexanoate | 6 |
| propyleneglycol monopropyl ether | 130 |

*acid phosphoxy polyoxy propylene glycol monomethacrylate propylenoxide 5–6 moles, Koni Chem. K.K.

A weight average molecular weight of the reaction product was 16,000.

In a separate 1 l glass reactor fitted with a stirrer, a condenser and a thermometer, was placed 67 parts of trimethylol propane triglycidyl ether (epoxy equivalent 150), 71 parts of 3-methyl salicylic acid and 46 parts of ethyleneglycol monobutyl ether acetate and after heating to 120° C., the mixture was added with 1.3 parts of trimethyl ammonium chloride (as a catalyst) and reacted for 5 hours.

At that stage, the acid value of the reaction mixture was 5.5, showing a reaction percentage of 96.6%.

Next, the reaction mixture was allowed to cool to 10° C., an 125 parts of 1,2-naphthoquinone diazide-5-sulfonyl chloride and 600 parts of acetone added.

To this, 40 parts of triethylamine was added dropwise and the combination was reacted at 10° C. for 2 hours.

Thereafter, the reaction mixture was added dropwise to a large quantity of a 2% aqueous HCl solution to effect precipitation.

The precipitate was filtered, washed with water and dried under reduced pressure at 40° C. for 18 hours, to obtain a positive type photosensitive resin. (95% yield)

To 107 parts of the abovementioned acrylic resin varnish, a solution of 20 parts of the abovementioned positive type photosensitive resin in 20 parts of propyleneglycol monomethyl ether was added and 3.6 parts of triethyl amine and 825.4 parts of deionized water were further added to obtain an electrodeposition coating composition.

Next, following the procedures of Example 4, a positive type photosensitive resin coating of 7 μm thickness was prepared on a board having 43 μm copper layer by using an electrodeposition coating means (a direct current 50 mA/dm²: electrodeposition time 90 seconds).

The thus formed resin coating was free from pin-holes, had a uniform coating thickness and the whole inside of the respective through-hole was completely covered with the resin layer.

Using the same procedures as stated in Example 4, the formed plate was exposed to UV rays, developed and etched to obtain a circuit pattern having a minimum line width of 30 μm and being free from defects.

The copper within the unexposed through-hole completely remained and electric passage was secured.

What is claimed is:

1. A positive type photosensitive resinous composition consisting essentially of a mixture of a binder resin component and a quinone diazide compound as essential components, the resin being a copolymer of (a) at least one phosphoric acid ester monomer represented by the formula:

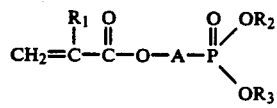

wherein $R_1$ represents hydrogen, chlorine atom or methyl;

A is $-R_4-O-$, $\mathrm{\text{-}\!(R_5\text{-}O\text{-}\!)_{\overline{m}}}$ or $-R_6\mathrm{\text{-}\!(O\text{-}\underset{\underset{O}{\|}}{C}\text{-}R_7\text{-}O\text{-}\!)_{\overline{n}}}$;

$R_4$ is a straight- or branched chain alkylene having 2 to 6 carbon atoms or cyclic alkylene having 3 to 6 carbon atoms; $R_5$ is an alkylene having 2 to 5 carbon atoms; $R_6$ is ethylene or propylene; $R_7$ is an alkylene having 2 to 7 carbon atoms; m and n are the average numbers of the respective repeating units and m is 1–10 and n is 2–50; $R_2$ and $R_3$ are the same or different groups and selected from alkyl, substituted alkyl or phenyl in an amount of 0.05 to 20 parts by weight per 100 parts by weight of the copolymer, (b) at least an $\alpha,\beta$-ethylenically unsaturated monomer containing acid groups in an amount to give an acid value of the copolymer of 20 to 200, and (c) other copolymerizable $\alpha,\beta$-ethylenically unsaturated monomers other than (a) and (b).

* * * * *